(12) United States Patent
Leung et al.

(10) Patent No.: US 12,534,657 B2
(45) Date of Patent: Jan. 27, 2026

(54) TWO-PHASE IMMERSION COOLING

(71) Applicant: Nano and Advanced Materials Institute Limited, Hong Kong (HK)

(72) Inventors: Chi Ming Leung, Hong Kong (HK); Sze Chun Yiu, Hong Kong (HK); Chi Hin Wong, Hong Kong (HK); Chi Ho Kwok, Hong Kong (HK); Chenmin Liu, Hong Kong (HK)

(73) Assignee: Nano and Advanced Materials Institute Limited, Hong Kong (HK)

( * ) Notice: Subject to any disclaimer, the term of this patent is extended or adjusted under 35 U.S.C. 154(b) by 516 days.

(21) Appl. No.: 18/187,712

(22) Filed: Mar. 22, 2023

(65) Prior Publication Data
US 2023/0303901 A1   Sep. 28, 2023

Related U.S. Application Data

(60) Provisional application No. 63/322,647, filed on Mar. 23, 2022.

(51) Int. Cl.
C09K 5/04 (2006.01)
H05K 7/20 (2006.01)

(52) U.S. Cl.
CPC ............. *C09K 5/048* (2013.01); *H05K 7/203* (2013.01); *H05K 7/20327* (2013.01)

(58) Field of Classification Search
CPC ...................................................... C09K 5/048
See application file for complete search history.

(56) References Cited

U.S. PATENT DOCUMENTS

| | | | |
|---|---|---|---|
| 3,445,507 A | 5/1969 | Newallis et al. | |
| 7,651,627 B2 | 1/2010 | Costello et al. | |
| 8,193,393 B2 | 6/2012 | Flynn et al. | |
| 8,261,560 B2 | 9/2012 | Flynn et al. | |
| 8,535,559 B2 | 9/2013 | Flynn et al. | |
| 2007/0023740 A1 | 2/2007 | Michael | |
| 2014/0311146 A1 | 10/2014 | Fayemi et al. | |
| 2020/0178414 A1* | 6/2020 | Bulinski | C07C 211/24 |
| 2021/0410320 A1 | 12/2021 | Yang et al. | |
| 2022/0033340 A1* | 2/2022 | Sharratt | H01M 10/0569 |
| 2022/0264761 A1 | 8/2022 | Keehn et al. | |

FOREIGN PATENT DOCUMENTS

| | | |
|---|---|---|
| EP | 1261398 B2 | 12/2002 |
| JP | 2008290994 A | 12/2008 |
| JP | 5018067 B2 | 9/2012 |
| WO | 2012134860 A1 | 10/2012 |
| WO | 2012170196 A1 | 12/2012 |
| WO | 2014095407 A1 | 6/2014 |
| WO | 2016064585 A1 | 4/2016 |
| WO | 2016094113 A1 | 6/2016 |
| WO | 2017098234 A1 | 6/2017 |
| WO | 2018048675 A1 | 3/2018 |
| WO | 2018172919 A1 | 9/2018 |
| WO | 2018224908 A1 | 12/2018 |
| WO | 2020055444 A1 | 3/2020 |
| WO | 2020058725 A2 | 3/2020 |
| WO | 2020229953 A1 | 11/2020 |
| WO | 2020250104 A1 | 12/2020 |
| WO | 2021055560 A1 | 3/2021 |

OTHER PUBLICATIONS

"Perfluoro(2-methyl-3-pentanone)", Wikipedia, the free encyclopedia, download on Jul. 28, 2023 URL: https://en.wikipedia.org/wiki/Perfluoro(2-methyl-3-pentanone)#cite_note-2.

Gigabyte, "Implement Immersion Cooling in Your IT Deployment Strategy", Immersion Cooling Solution for Data Centers, download on Jul. 28, 2023 URL: https://www.gigabyte.com/Solutions/immersion-cooling.

Gigabyte, An improved PUE solution with Two-Phase Liquid Immersion Cooling, Youtube, Jan. 23, 2019. URL: https://www.youtube.com/watch?v=SP9yXBWPK2Q.

Corvalent, Boiling Liquid Submersion Cooling Computer (not submerged in mineral oil), Youtube, Sep. 9, 2010. URL: https://www.youtube.com/watch?v=Z_X_hgtlJpA.

* cited by examiner

*Primary Examiner* — Peter F Godenschwager
(74) *Attorney, Agent, or Firm* — IDEA Intellectual Limited; Sam T. Yip

(57) ABSTRACT

An immersion cooling system includes a fluid-retaining container having space for accommodating an electronic device. A heat transfer fluid is in contact with the electronic device. A heat exchanger contacts and condenses vapor from vaporization of the heat transfer fluid. The heat transfer fluid has a thermal conductivity higher than 0.08 W m$^{-1}$K$^{-1}$, a dielectric constant ($D_k$) 20-40 GHz less than 3.0, and a heat of vaporization higher than 150 kJ kg$^{-1}$, with fire retarding features, compatibility with plastics, metals, rubbers and includes a partially fluorinated compound. The improved immersion cooling system includes fluids with increased thermal conductivity and heat of vaporization while reducing fluid density and maintaining the advantages of the fluid being non-flammable, having high electrical stability and a low dielectric constant.

19 Claims, 1 Drawing Sheet

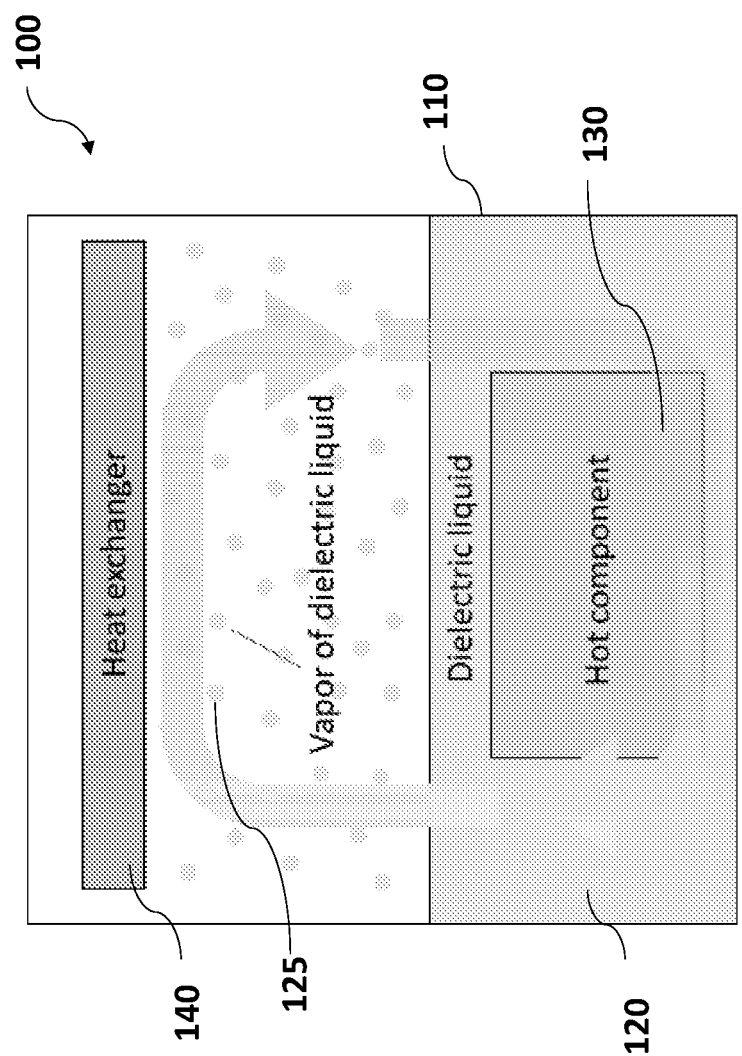

TWO-PHASE IMMERSION COOLING

CROSS-REFERENCE TO RELATED APPLICATION

The present application claims priority from U.S. provisional patent application Ser. No. 63/322,647 filed 23 Mar. 2022, the disclosure of which are incorporated by reference in their entirety.

FIELD OF THE INVENTION

The present invention relates to immersion cooling systems and, more particularly, to two-phase immersion cooling systems using novel coolants with good thermal conductivity, high heat of vaporization, and low dielectric constant value at high frequency.

BACKGROUND

Currently there are increasing demands in data-processing and storage capabilities required by data centers, with a large number of heat-generating electronic devices being placed in close proximity to one another. These high-power electrical systems generate considerable amounts of heat such that conventional air-based cooling systems (fans, air-conditioned environments) are unable to maintain a satisfactory operating temperature.

Immersion cooling is a recently-developed direct cooling technique in which heat is removed by circulating a dielectric liquid into direct contact with heat-generating components placed in a cooling tank. The dielectric liquid is cooled by one or more heat exchangers. Immersion cooling methods include single-phase and two-phase methods. For single-phase immersion cooling, the dielectric liquid circulates across the heat-generating components with the heated dielectric liquid being cooled by a heat exchanger with no phase change of the fluid during the process. For two-phase immersion cooling, the dielectric liquid directly contacts the heat-generating components with excess heat generating a phase change to a vapor. The vaporized dielectric liquid condenses via a heat exchanger and returns to the immersion cooling tank.

The heat transfer dielectric fluid should be non-flammable and possess no flash point, which is important for safety and long-term use. Furthermore, the fluid should also be chemically and electrically stable and inert and be compatible with materials commonly used in the electrical components. Generally, perfluorinated or partial fluorinated compounds can fulfill these requirements. However, the current development of materials used in two-phase systems is very limited. An existing commercial material system used in two-phase immersion cooling is NOVEC® 1230/649 engineered fluid manufactured by 3M. The properties of this fluid include no flash point, a high dielectric strength, a low dielectric constant and high reliability. However, the disadvantages are its high density, low boiling point, low heat of vaporization, low thermal conductivity, as well as its relatively high cost and complex process for mass-production.

Thus, there is a need in the art for improved immersion cooling systems that include fluids with increased thermal conductivity and heat of vaporization while reducing fluid density and maintaining the advantages of the fluid being non-flammable, having high electrical stability and a low dielectric constant. The present invention addresses this need for improved immersion cooling.

SUMMARY OF THE INVENTION

The present invention provides an immersion cooling system that includes a fluid-retaining container having space for accommodating an electronic device. A heat transfer fluid is positioned in the container such that the electronic device is in contact with the heat transfer fluid. A heat exchanger communicates with the fluid-retaining container such that vapor from vaporization of the heat transfer fluid contacts the heat exchanger. The heat transfer fluid has a thermal conductivity higher than 0.08 W m$^{-1}$K$^{-1}$, a dielectric constant ($D_k$) at 20-40 GHz less than 3.0, and a heat of vaporization higher than 150 kJ kg'. The heat transfer fluid includes a compound of formula (I).

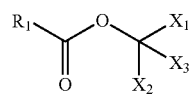

formula (I)

$X_1$, $X_2$ and $X_3$ are independently selected from hydrogen, deuterium, halogen, —CH$_3$, —CF$_3$, —CHF$_2$, —CH$_2$F, —OCH$_3$, —OCF$_3$, —OCH$_2$CH$_3$, —OCH$_2$CF$_3$, —OCF$_2$CF$_3$, —CH$_2$CF$_3$, —CF$_2$CF$_3$, —CH$_2$CF$_2$CF$_3$, —CF$_2$CF$_2$CF$_3$, —OCH$_2$CF$_2$CF$_3$, —CH$_2$CH$_2$CF$_3$.
$R_1$ is selected from hydrogen, deuterium, halogen, C1-C10 alkyl, C3-C8 cycloalkyl, C2-C6 alkenyl, C3-C6 cycloalkenyl, C5-C7 (hetero)alkyl, C2-C6 alkyl ether with or with substitution by one or more fluorine atoms. The elemental wt. % of fluorine atoms is less than 65%.

In another aspect, at least one of $X_1$, $X_2$ and $X_3$ is selected from hydrogen or deuterium and at least one of $X_1$, $X_2$ and $X_3$ is selected from —CF$_3$.

In another aspect, $R_1$ is selected from a C1-C10 straight or branched chain alkyl group with or with substitution by one or more fluorine atoms.

In another aspect, $R_1$ is selected from —CH$_3$, —CF$_3$, —CH$_2$CH$_3$ or —CH$_2$CF$_3$.

In another aspect, a total number of fluorinated carbons in formula (I) is less than or equal to 3.

In another aspect, the boiling point of the heat transfer fluid ranges from 50° C. to 100° C.

In another aspect, the heat transfer fluid is non-flammable and possess no flash point.

In another aspect, the density of the heat transfer fluid is less than 1450 kg m$^{-3}$.

In another aspect, the heat transfer fluid further comprises a density-reducing agent having a density less than 1200 kg m$^{-3}$ in an amount less than or equal to 50 percent by weight.

In another aspect, the density-reducing agent is selected from diethyl ether, petroleum ether, tetrahydrofuran, hexane, heptane, octane, cyclohexane, diglyme, 2-butanone, ethyl acetate, ethyl propionate, methyl propionate, hexane, heptane, octene, or dimethyl carbonate.

In another aspect, the heat transfer fluid further comprises a flame retardant in an amount less than or equal to 50 percent by weight.

In another aspect, the flame retardant is selected from 1,1,1,2,3,3,3-heptafluoropropane, 1,1,1,2,2-pentafluoroethane, bromochlorodifluoromethane, bromotrifluoromethane, perfluoro(2-methyl-3-pentanone, perfluoro(2,4-dimethyl-3-pentanone), heptafluoro-1-methoxpropane, methyl nonafluoroisobutyl ether, ethyl nonafluoroisobutyl ether, 3-methoxyperfluoro(2-methylbutane), 1,1,1,2,2,3,4,5,5,5-decafluoro-3-methoxy-4-(trifluoromethyl)pentane, perfluoro(4-methylpent-2-ene), trimethyl phosphate, triethyl phosphate, tripropyl phosphate, tributyl phosphate, triphenyl phosphate, trixylyl phosphate, or tris(1-chloro-2-propyl) phosphate.

In another aspect, the heat transfer fluid includes the compound of formula (I) in an amount from 25 to 80 wt. % based on the total weight of the heat transfer fluid.

In another aspect, the heat transfer fluid includes the compound of formula (I) in an amount from 50 to 70 wt. %, based on the total weight of the heat transfer fluid.

The compound of formula (I) may be compatible with plastics, metals and rubbers of electronic components cooled by the immersion cooling system.

The plastics may be one or more of epoxy, ABS resin, PP, PE, PC, PTFE or FR-4.

The metals may be one or more of copper, navy copper, Cupronickel, 304 stainless steel, 316 stainless steel, 6061 aluminum alloys, H68 brass, H62 brass, H59 brass, L245 alloy, lead tin alloys, or tin copper alloys.

The rubber may be one or more of silicone-based rubbers, nitrile rubbers, fluoro-rubbers, neoprene, EPDM, hydrogenated nitrile rubbers or polyurethane-based rubbers.

When using a fire retardant, the coolant vapor may extinguish fire within 5 seconds.

BRIEF DESCRIPTION OF THE DRAWINGS

FIG. 1 is a schematic of an immersion cooling system according to an embodiment.

DETAILED DESCRIPTION

For two-phase immersion cooling, a major factor affecting the heat exchange efficiency is the heat of vaporization of the heat transfer fluid, which is the amount of energy that must be absorbed by the fluid to convert the fluid into a gas. The higher the heat of vaporization, the more heat that is absorbed by the fluid to undergo the phase change. Therefore, the present invention provides, in part, an improved immersion cooling system in which the heat transfer fluid has a higher heat of vaporization than existing immersion cooling systems. FIG. 1 depicts a two-phase immersion cooling system 100 according to an embodiment. Immersion cooling system 100 includes a fluid-retaining container 110 having space for accommodating an electronic device 130. Typically, in a data center environment, electronic device 130 may be a server or a server component.

A heat transfer fluid 120 is positioned in the container 110 such that the electronic device 130 is in contact with heat transfer fluid 120. A heat exchanger 140 communicates with the fluid-retaining container 110 such that vapor 125 from vaporization of the heat transfer fluid 120 contacts the heat exchanger 140. The heat exchanger is maintained at a temperature that is lower than the boiling point of the heat exchange fluid. Upon contacting the heat exchanger 140, the vapor 125 condenses and returns to the reservoir of heat exchange fluid 120. The heat released by condensation is transferred to the heat exchanger.

Although not shown in FIG. 1, the immersion cooling system 100 can further include pumps for circulating the heat exchange fluid, and pumps for circulating a coolant within the heat exchanger. The heat exchanger may have a variety of different surfaces and configurations depending upon the size of the immersion cooling system 100 and the volume of vapor to be condensed by the heat exchanger. For example, the heat exchanger may include fins, plates, coils, and other known heat exchanger surfaces. Typically, water is used as the coolant within the heat exchanger; cold air and other known refrigerants may also be used.

Heat of vaporization ($\Delta H_{vap}$), also known as the latent heat or heat of evaporation, is the amount of energy (enthalpy) that must be added to a liquid substance to transform a quantity of that substance into a gas. It is an important parameter for two-phase immersion cooling system. The more heat can be carried out from the system by the heat transfer fluid with high heat of vaporization. In some embodiments, according to the ASTM E2071 testing method disclosed "Standard Practice for Calculating Heat of Vaporization or Sublimation from Vapor Pressure Data", the heat of vaporization of the heat transfer fluid of the present disclosure is higher than 150 kJ kg$^{-1}$.

The thermal conductivity of a material is a measure of its ability to conduct heat. In two phase immersion cooling system, it is important that the heat transfer rate from the hot component to the contacted engineered heat transfer fluid. In some embodiments, according to the ASTM D7896 testing method disclosed "Standard Test Method for Thermal Conductivity, Thermal Diffusivity, and Volumetric Heat Capacity of Engine Coolants and Related Fluids by Transient Hot Wire Liquid Thermal Conductivity Method", the heat transfer fluid 120 of the present disclosure has a thermal conductivity higher than 0.08 W m$^{-1}$K$^{-1}$.

The dielectric constant ($D_k$) is the permittivity of a material expressed as a ratio with the electric permittivity of a vacuum. It is a measure of the ability of a material to store electric energy in an electrical field. The signal loss is less when the electrical component is immersed in the low $D_k$ materials. In some embodiments, the $D_k$ values of the dielectric fluid at frequency from 10 MHz to 50 GHz was measured by N1601A Dielectric probe kit. The heat transfer fluid 120 of the present disclosure has a dielectric constant ($D_k$) at 20-40 GHz less than 3.0.

The heat transfer fluid includes a compound of formula (I):

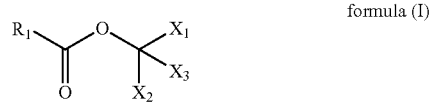

formula (I)

$X_1$, $X_2$ and $X_3$ are independently selected from hydrogen, deuterium, halogen, —$CH_3$, —$CF_3$, —$CHF_2$, —$CH_2F$, —$OCH_3$, —$OCF_3$, —$OCH_2CH_3$, —$OCH_2CF_3$, —$OCF_2CF_3$, —$CH_2CF_3$, —$CF_2CF_3$, —$CH_2CF_2CF_3$, —$CF_2CF_2CF_3$, —$OCH_2CF_2CF_3$, —$CH_2CH_2CF_3$.

In one embodiment, at least one of $X_1$, $X_2$ and $X_3$ is selected from hydrogen or deuterium and at least one of $X_1$, $X_2$ and $X_3$ is selected from —$CF_3$.

$R_1$ is selected from hydrogen, deuterium, halogen, C1-C10 alkyl, C3-C8 cycloalkyl, C2-C6 alkenyl, C3-C6 cycloalkenyl, C5-C7 (hetero)alkyl, C2-C6 alkyl ether with or with substitution by one or more fluorine atoms. In one embodiment, $R_1$ may be a C1-C10 straight or branched chain alkyl group with or with substitution by one or more fluorine atoms; examples of $R_1$ include —$CH_3$, —$CF_3$, —$CH_2CH_3$ or —$CH_2CF_3$.

In one embodiment, $R_1$ in formula (I) may be selected from hydrogen, deuterium, and the group consisting of: (1) halogen, may be selected from the group consisting of: fluorine, chlorine, bromine and iodine atom; (2) C1-C10 alkyl, further, may be selected from the following groups: methyl, ethyl, n-propyl, isopropyl, n-butyl, isobutyl, secbutyl, tert-butyl, 2-methylbutyl, n-pentyl, n-hexyl, n-heptyl, n-octyl, 2-ethylhexyl, trifluoromethyl, pentafluoromethyl, 2,2,2-trifluoroethyl; (3) C3-C8 cycloalkyl, further, may be selected from the following groups: cyclopropyl, cyclobutyl, cyclopentyl cyclohexyl, cycloheptyl, cyclooctyl; (4) C2-C6 alkenyl, further, may be selected from the following groups: vinyl, propenyl, butenyl, pentenyl, hexenyl; (5) C3-C6 cycloalkenyl, further, may be selected from the following groups: cyclopentenyl, cyclohexenyl, cycloheptenyl, cyclooctenyl; (5) C2-C6 alkyl ether group, further, may be selected from the following groups: methoxyl, ethoxyl, n-propoxyl, isopropoxyl, n-butoxyl, isobutoxyl, or sec-butoxyl, tert-butoxyl or 2-methylbutoxyl.

In one embodiment, the compound described in formula (I) is a partially fluorinated compound with elemental wt. % of fluorine atoms of less than 65%.

In one embodiment, the total number of fluorinated carbons in formula (I) is less than or equal to 3.

In one embodiment, the elemental wt. % of fluorine atoms in formula (I) is less than 60%.

As used herein, "hetero" means an atom other than carbon (e.g., oxygen, nitrogen, or sulfur) that is bonded to a carbon chain (straight or branched or in a ring.

As used herein, the term "or" includes "and/or" unless the context dictates otherwise.

In the present invention, "substitution by one or more fluorine atoms" means that one or more hydrogen atoms on the carbon atoms in the substituent group is replaced by the fluorine atoms.

Specific suitable examples of the heat transfer fluid according to the present disclosure are given below, but are not limited to:

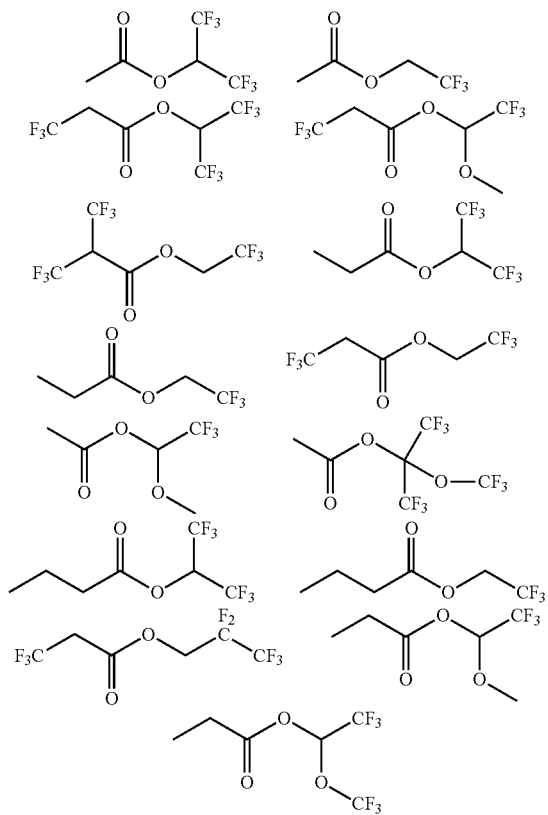

The heat transfer fluid with higher boiling point can be used in the heat generating component with higher operation temperature. The development of computer chips, 5G technology and the increasing data processing power with increasing in number of severs and printed circuit board in data center also generated higher heat amount. Therefore, the heat transfer fluids of the present invention are engineered to have a higher boiling point than conventional heat transfer fluids. The testing method of the boiling point of the heat transfer fluid is according to the ASTM D1120-08 "Standard Test Method for Boiling Point of Engine Coolants". In some embodiments, the boiling point of the heat transfer fluid 120 ranges from 50° C. to 100° C. In some embodiments, the heat transfer fluids 120 of the present disclosure may have a boiling point between 50-100° C., or 60-90° C., 65-80° C.

In some embodiments, according to the ASTM D3828-16a(2021) testing method disclosed "Standard Test Methods for Flash Point by Small Scale Closed Cup Tester", the fluorinated heat transfer fluid 120 of the present disclosure is non-flammable and possess no flash point.

In addition to having a higher boiling point, it is desirable to lower the density of the heat transfer fluid. Lower density fluids require less fuel to transport a certain weight of heat transfer fluid and require less energy to pump and circulate in a data center environment. The testing method of the density of the heat transfer fluid is according to the ASTM D1298-12b (2017) "Standard Test Method for Density, Relative Density, or API Gravity of Crude Petroleum and Liquid Petroleum Products by Hydrometer Method". In some embodiments, the density of heat transfer fluid 120 is less than 1450 kg m$^{-3}$. This lower-density heat transfer fluid may be achieved by employed a density-reducing agent having a density less than 1200 kg m$^{-3}$ in an amount less than or equal to 50 percent by weight of the heat transfer fluid. Examples of the density-reducing agent include diethyl ether, petroleum ether, tetrahydrofuran, hexane, heptane, octane, cyclohexane, diglyme, 2-butanone, ethyl acetate, ethyl propionate, methyl propionate, hexane, heptane, octene, or dimethyl carbonate.

Due to the nature of the data center environment, it may be desirable to include a flame retardant in an amount less than or equal to 50 percent by weight of the heat transfer fluid. The flame retardant may be one or more of 1,1,1,2,3,3,3-heptafluoropropane, 1,1,1,2,2-pentafluoroethane, bromochlorodifluoromethane, bromotrifluoromethane, perfluoro(2-methyl-3-pentanone, perfluoro(2,4-dimethyl-3-pentanone), heptafluoro-1-methoxpropane, methyl nonafluoroisobutyl ether, ethyl nonafluoroisobutyl ether, 3-methoxyperfluoro(2-methylbutane), 1,1,1,2,2,3,4,5,5,5-decafluoro-3-methoxy-4-(trifluoromethyl)pentane, perfluoro(4-methylpent-2-ene), trimethyl phosphate, triethyl phosphate, tripropyl phosphate, tributyl phosphate, triphenyl phosphate, trixylyl phosphate, or tris(1-chloro-2-propyl) phosphate. Using a flame retardant, a fire can be extinguished within 5 seconds.

In view of the density-reducing additives and the flame retardant additives, the heat transfer fluid may include the compound of formula (I) in an amount from 1 to 100 wt. % of the total weight of the heat transfer fluid. In particular, the compound of formula (I) may be 25 to 80 wt. % based on the total weight of the heat transfer fluid or, more particularly, 50 to 70 wt. %, based on the total weight of the heat transfer fluid.

In an embodiment, the heat transfer fluid of present disclosure is a liquid.

In another embodiment, the heat transfer fluid of present disclosure is suspension.

In another embodiment, the heat transfer fluid of present disclosure is a nano-fluid, in which the heat transfer fluid is mixed with nanoparticles including carbon nanoparticles, multiwalled carbon nanotube (MWCNT), single wall carbon nanotube (SWCNT), graphene, graphene oxide, graphite, fullerene, diamond, silver nanoparticles, gold nanoparticles, copper nanoparticles, aluminum nanoparticles, iron nanoparticles, nickel nanoparticles, zinc nanoparticles, aluminum oxide ($Al_2O_3$) nanoparticles, titanium dioxide ($TiO_2$) nanoparticles, silicon nanoparticles, silicon carbide nanoparticles, boron nitride nanoparticles, silicon dioxide nanoparticles, or aluminum nitride nanoparticles.

Importantly, the cooling system and coolant of the present invention is compatible with the plastics, metals and rubbers as used in motherboards of electronic components that will be cooled by the system. That is, the coolant does not react with these materials or degrade them in any way. For example, the coolant is compatible to plastics including epoxy, ABS resin, PP, PE, PC, PTFE and FR-4, as well as other plastics/polymers used in electronic components.

The coolant is compatible with metals found in electronic devices such as copper, navy copper, Cupronickel, 304 stainless steel, 316 stainless steel, 6061 aluminum alloys, H68 brass, H62 brass, H59 brass, L245 alloy, lead tin alloys, or tin copper alloys. Further, the coolant does not react with or degrade semiconductor materials such as silicon, GaAs, GaN, indium-based semiconductors, and the dopants found within semiconductor devices.

The immersion cooling system coolant is also compatible with rubbers/sealants that are used in semiconductor device packaging and in housings that contain electronic devices such as servers. The coolant is compatible with silicone-based rubbers, nitrile rubbers, fluoro-rubbers, neoprene, EPDM, hydrogenated nitrile rubbers and polyurethane-based rubbers.

The heat transfer fluids used in the immersion cooling systems of the present invention may be made using relatively inexpensive fabrication techniques in which precursor materials are mixed and reacted under relatively low temperature conditions. In addition, the production method is environmentally friendly without using toxic and dangerous chemicals. Since, organic solvents are hazardous substances that require special treatment and disposal procedures, only water and water-soluble chemicals have been employed for the production method of the heat transfer fluid in present disclosure. The heat transfer fluid is readily separated from the reaction products and is easily purified using conventional distillation techniques.

EXAMPLES

A two-phase immersion cooling system with a fluid-retaining container having space for accommodating an electronic device, a heat transfer fluid positioned in the container such that the electronic device is in contact with the heat transfer fluid and a heat exchanger communicating with the fluid-retaining container such that vapor from vaporization of the heat transfer fluid contacts the heat exchanger. The heat transfer fluid used is 1,1,1,3,3,3-hexafluoropropan-2-yl acetate (Example 1) or 75 wt. % 2,2,2-trifluoroethyl 3,3,3-trifluoropropanoate with 15 wt. % dimethyl carbonate as density reducing agent and 10 wt. % perfluoro(4-methylpent-2-ene) as a flame retardant (Example 2) or 80 wt. % 2,2,2-trifluoro-1-methoxyethyl acetate with 20 wt. % trimethyl phosphate as a flame retardant (Example 3) or NOVEC 649 Engineered Fluid (Comparative Example 1) or NOVEC 7000 Engineered Fluid (Comparative Example 2) or NOVEC 7100 Engineered Fluid (Comparative Example 3).

Preparation of Example 1

Synthesis of 1,1,1,3,3,3-hexafluoropropan-2-yl acetate

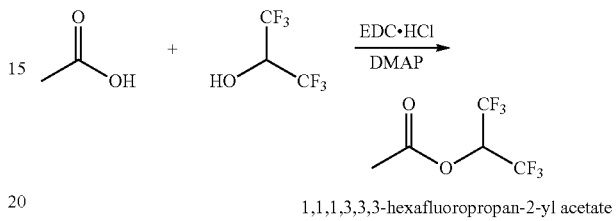

1,1,1,3,3,3-hexafluoropropan-2-yl acetate 1-(3-Dimethylaminopropyl)-3-ethylcarbodiimide hydrochloride (EDC·HCl, CAS: 25952-53-8) (200 g, 1 eq) and 4-dimethylaminopyridine (DMAP, CAS: 1122-58-3) (38.3 g, 0.3 eq) was mixed into a 1000-mL round bottom flask and deionized water (500 mL) was added to dissolve the solid. Glacial acetic acid (CAS: 64-9-7) (75.4 g, 1.2 eq) and 1,1,1,3,3,3-hexafluoro-2-propanol (HFIP, CAS: 920-66-1) (184.7 g, 1.05 eq) were then added slowly to the EDC·HCl and DMAP mixture to avoid the temperature rise. The reaction was stirred and was warmed up to 40° C. for 24 hours. Then, the reaction was settled down and two layers was separated. The upper aqueous layer was removed and the bottom organic layer was then distillated. The component which having the boiling point around 70° C. was collected. Yield: 132 g (60%). The product was analyzed and confirmed by NMR: $^1$H NMR [500 MHz, $CDCl_3$]: δ 2.25 (s, 3H), 5.71-5.78 (septet, 1H) and $^{19}$F NMR [500 MHz, $CDCl_3$]: δ 73.62 (s, 6F).

Preparation of Example 2

Synthesis of 2,2,2-trifluoroethyl 3,3,3-trifluoropropanoate

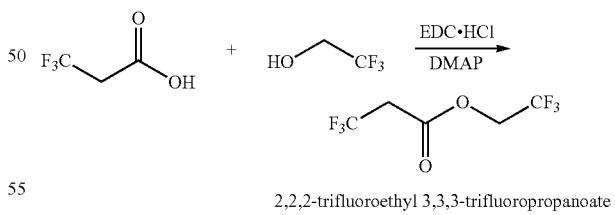

2,2,2-trifluoroethyl 3,3,3-trifluoropropanoate

EDC·HCl (200 g, 1 eq) and DMAP (38.3 g, 0.3 eq) was mixed into a 1000-mL round bottom flask and deionized water (500 mL) was added to dissolve the solid. 3,3,3-trifluoropropanoic acid (CAS: 2516-99-6) (147.5 g, 1.1 eq) and 2,2,2-trifluoroethanol (TFE, CAS: 75-89-8) (110 g, 1.05 eq) were then added slowly to the EDC·HCl and DMAP mixture to avoid a temperature rise. The reaction was stirred and was warmed up to 40° C. for 24 hours. Then, the reaction was settled down and two layers were separated. The upper aqueous layer was removed and the bottom organic layer was then distillated. The component having a boiling point below 80° C. was collected. Yield: 125.4 g (57%). The product was analyzed and confirmed by NMR: $^1$H NMR [500 MHz, CDCl$_3$]: δ 2.77 (q, 2H), 4.60 (q, 2H) and $^{19}$F NMR [500 MHz, CDCl$_3$]: δ 74.86 (s, 3F), δ 92.27 (s, 3F).

Example 2 is 75 wt. % 2,2,2-trifluoroethyl 3,3,3-trifluoropropanoate with 15 wt. % dimethyl carbonate as a density reducing agent and 10 wt. % perfluoro(4-methylpent-2-ene) as a flame retardant.

Preparation of Example 3

Synthesis of 2,2,2-trifluoro-1-methoxyethyl acetate

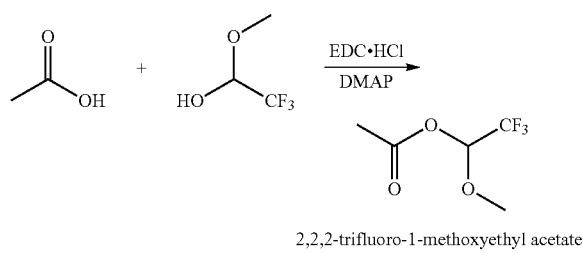

2,2,2-trifluoro-1-methoxyethyl acetate

EDC·HCl (200 g, 1 eq) and DMAP (38.3 g, 0.3 eq) were mixed into a 1000-mL round bottom flask and deionized water (500 mL) was added to dissolve the solid. Glacial acetic acid (CAS: 64-19-7) (75.4 g, 1.2 eq) and trifluoroacetaldehyde methyl hemiacetal (CAS: 431-46-9) (142.5 g, 1.05 eq) were then added slowly to the EDC·HCl and DMAP mixture to avoid the temperature rise. The reaction was stirred and was warmed up to 40° C. for 24 hours. Then, the reaction was settled down and two layers was separated. The upper aqueous layer was removed and the bottom organic layer was then distillated. The component which having the boiling point below 80° C. was collected. Yield: 73.6 g (41%). The product was analyzed and confirmed by NMR: $^1$H NMR [500 MHz, CDCl$_3$]: δ 2.03 (s, 3H), δ 3.40 (s, 3H), 7.28 (q, 1H) and $^{19}$F NMR [500 MHz, CDCl$_3$]: δ 77.11 (s, 3F).

Example 3 is 80 wt. % 2,2,2-trifluoro-1-methoxyethyl acetate with 20 wt. % trimethyl phosphate as a flame retardant.

The chemical structures of the density reducing agent and flame retardants are shown as follows:

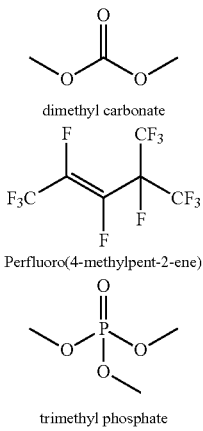

For those commercially-available engineered fluids, comparative examples CE1, CE2, and CE3 were purchased from 3M and were used directly without further treatment.

Table 1 shows the properties of the examples of heat transfer fluid used and the comparison with the commercially-available fluids:

TABLE 1

|  | CE1 | CE2 | CE3 | Example 1 | Example 2 | Example 3 |
|---|---|---|---|---|---|---|
| Partial/Fully fluorinated | Fully | Partial | Partial | Partial | Partial | Partial |
| elemental wt. % of fluorine atoms of major component | 72.14% | 66.48% | 68.38% | 54.26% | 54.26% | 33.12% |
| Boiling pt. (° C.) | 49 | 34 | 61 | 70.6 | 75 | 72 |
| Density (kg/m$^3$) | 1596 | 1400 | 1523 | 1418 | 1298 | 1327 |
| Flash point | No | No | No | No | No | No |
| Vapor Pressure (kPa) | 40 | 65 | 27 | 19 | 17 | 15 |
| Dielectric strength | >40 kV | >40kV | >40 kV | >43.2 kV | >40 kV | >40 kV |
| Dielectric constant (@1 kHz) | 1.8 | 7.4 | 7.4 | 5.18 | 5.03 | 4.89 |
| Dielectric constant (@20 GHz) | 1.94 | 4.97 | 3.95 | 2.97 | 2.95 | 2.97 |
| Dielectric constant (@40 GHz) | 2.01 | 3.56 | 3.06 | 2.75 | 2.83 | 2.66 |
| Heat of vaporization (kJ/kg) | 88 | 142 | 112 | 150.47 | 167 | 175 |
| Thermal conductivity (Wm$^{-1}$K$^{-1}$) | 0.06 | 0.075 | 0.07 | 0.08 | 0.09 | 0.08 |

As seen in Table 1, the heat transfer fluid of the present disclosure offered a relatively lower elemental weight percentage of fluorine atom than the commercially-available product. While the fluid of the present invention obtains suitable boiling point range, no flash point, high dielectric strength, low dielectric constant with high heat of vaporization and thermal conductivity. In addition, the heat transfer fluid of the present disclosure has a substantially higher boiling point, a high dielectric strength, a higher heat of vaporization and a substantially higher thermal conductivity than the prior art materials. As the heat of vaporization correlates directly to the efficiency of the heat transfer process for a two-phase immersion cooling system the present system demonstrates a higher capacity for heat transfer. Furthermore, in order to compare the partially fluorinated compounds, at both low frequency (1 kHz), high frequency (20 GHz) and very high frequency (40 GHz), the heat transfer fluid of the present disclosure has the lower dielectric constant value than that of the commercial product CE2 and CE3.

As used herein, for ease of description, space-related terms such as "under", "below", "lower part", "above", "upper portion", "lower portion", "left side", "right side", and the like may be used herein to describe a relationship between one element or feature and another element or feature as shown in the figures. In addition to orientation shown in the figures, space-related terms are intended to encompass different orientations of the device in use or operation. A device may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "basically", "substantially", and "about" are used for describing and explaining a small variation. When being used in combination with an event or circumstance, the term may refer to a case in which the event or circumstance occurs precisely, and a case in which the event or circumstance occurs approximately. As used herein with respect to a given value or range, the term "about" generally means in the range of $\pm 10\%$, $\pm 5\%$, $\pm 1\%$, or $\pm 0.5\%$ of the given value or range. The range may be indicated herein as from one endpoint to another endpoint or between two endpoints. Unless otherwise specified, all the ranges disclosed in the present disclosure include endpoints. The term "substantially coplanar" may refer to two surfaces within a few micrometers (μm) positioned along the same plane, for example, within 10 within 5 within 1 or within 0.5 μm located along the same plane. When reference is made to "substantially" the same numerical value or characteristic, the term may refer to a value within $\pm 10\%$, $\pm 5\%$, $\pm 1\%$, or $\pm 0.5\%$ of the average of the values.

Several embodiments of the present disclosure and features of details are briefly described above. The embodiments described in the present disclosure may be easily used as a basis for designing or modifying other processes and structures for realizing the same or similar objectives and/or obtaining the same or similar advantages introduced in the embodiments of the present disclosure. Such equivalent construction does not depart from the spirit and scope of the present disclosure, and various variations, replacements, and modifications can be made without departing from the spirit and scope of the present disclosure.

The invention claimed is:

1. An immersion cooling system comprising:
a fluid-retaining container having space for accommodating an electronic device;
a heat transfer fluid positioned in the container such that the electronic device is in contact with the heat transfer fluid;
a heat exchanger communicating with the fluid-retaining container such that vapor from vaporization of the heat transfer fluid contacts the heat exchanger;
the heat transfer fluid having a thermal conductivity higher than 0.08 W m$^{-1}$K$^{-1}$, a dielectric constant (D$_k$) at 20-40 GHz less than 3.0, a heat of vaporization higher than 150 kJ kg$^{-1}$ and including a compound of formula (I) with elemental wt. % of fluorine atoms of less than 65%:

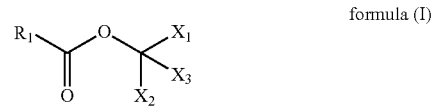

formula (I)

wherein $X_1$, $X_2$ and $X_3$ are independently selected from hydrogen, deuterium, halogen, —CH$_3$, —CF$_3$, —CHF$_2$, —CH$_2$F, —OCH$_3$, —OCF$_3$, —OCH$_2$CH$_3$, —OCH$_2$CF$_3$, —OCF$_2$CF$_3$, —CH$_2$CF$_3$, —CF$_2$CF$_3$, —CH$_2$CF$_2$CF$_3$, —CF$_2$CF$_2$CF$_3$, —OCH$_2$CF$_2$CF$_3$, —CH$_2$CH$_2$CF$_3$;

$R_1$ is selected from hydrogen, deuterium, halogen, C1-C10 alkyl, C3-C8 cycloalkyl, C2-C6 alkenyl, C3-C6 cycloalkenyl, C5-C7 (hetero)alkyl, C2-C6 alkyl ether, each of which is unsubstituted or substituted by one or more fluorine atoms.

2. The immersion cooling system of claim 1, wherein at least one of $X_1$, $X_2$ and $X_3$ is selected from hydrogen or deuterium and at least one of $X_1$, $X_2$ and $X_3$ is selected from —CF$_3$.

3. The immersion cooling system of claim 1, wherein $R_1$ is selected from a C1-C10 straight or branched chain alkyl group with or with substitution by one or more fluorine atoms.

4. The immersion cooling system of claim 1, wherein $R_1$ is selected from —CH$_3$, —CF$_3$, —CH$_2$CH$_3$ or —CH$_2$CF$_3$.

5. The immersion cooling system of claim 1, wherein a total number of fluorinated carbons in formula (I) is less than or equal to 3.

6. The immersion cooling system of claim 1, wherein the boiling point of the heat transfer fluid ranges from 50° C. to 100° C.

7. The immersion cooling system of claim 1, wherein the heat transfer fluid is non-flammable and possess no flash point.

8. The immersion cooling system of claim 1, wherein the density of the heat transfer fluid is less than 1450 kg m$^{-3}$.

9. The immersion cooling system of claim 1, wherein the heat transfer fluid further comprises a density-reducing agent having a density less than 1200 kg m$^{-3}$ in an amount less than or equal to 50 percent by weight.

10. The immersion cooling system of claim 9, wherein the density-reducing agent is selected from diethyl ether, petroleum ether, tetrahydrofuran, hexane, heptane, octane, cyclohexane, diglyme, 2-butanone, ethyl acetate, ethyl propionate, methyl propionate, hexane, heptane, octene, or dimethyl carbonate.

11. The immersion cooling system of claim 1, wherein the heat transfer fluid further comprises a flame retardant in an amount less than or equal to 50 percent by weight.

12. The immersion cooling system of claim 11, wherein coolant vapor extinguishes fire within 5 seconds.

13. The immersion cooling system of claim 11, wherein the flame retardant is selected from 1,1,1,2,3,3,3-heptafluoropropane, 1,1,1,2,2-pentafluoroethane, bromochlorodifluoromethane, bromotrifluoromethane, perfluoro (2-methyl-3-pentanone), perfluoro (2,4-dimethyl-3-pentanone), heptafluoro-1-methoxpropane, methyl nonafluoroisobutyl ether, ethyl nonafluoroisobutyl ether, 3-methoxyperfluoro (2-methylbutane), 1,1,1,2,2,3,4,5,5,5-decafluoro-3-methoxy-4-(trifluoromethyl) pentane, perfluoro (4-methylpent-2-ene), trimethyl phosphate, triethyl phosphate, tripropyl phosphate, tributyl phosphate, triphenyl phosphate, trixylyl phosphate, or tris(1-chloro-2-propyl)phosphate.

14. The immersion cooling system of claim 1, wherein the heat transfer fluid includes the compound of formula (I) in an amount from 25 to 80 wt. % based on the total weight of the heat transfer fluid.

15. The immersion cooling system of claim 1, wherein the heat transfer fluid includes the compound of formula (I) in an amount from 50 to 70 wt. %, based on the total weight of the heat transfer fluid.

16. The immersion cooling system of claim 1, wherein the compound of formula (I) is compatible with plastics, metals and rubbers of electronic components cooled by the immersion cooling system.

17. The immersion cooling system of claim 16, wherein the plastics are one or more of epoxy, ABS resin, PP, PE, PC, PTFE or FR-4.

18. The immersion cooling system of claim 16, wherein the metals are one or more of copper, navy copper, Cupronickel, 304 stainless steel, 316 stainless steel, 6061 aluminum alloys, H68 brass, H62 brass, H59 brass, L245 alloy, lead tin alloys, or tin copper alloys.

19. The immersion cooling system of claim 16, wherein the rubber is one or more of silicone-based rubbers, nitrile rubbers, fluoro-rubbers, neoprene, EPDM, hydrogenated nitrile rubbers or polyurethane-based rubbers.

* * * * *